(12) United States Patent
Armacost et al.

(10) Patent No.: US 6,489,005 B1
(45) Date of Patent: Dec. 3, 2002

(54) METHOD OF MAKING SILICON ARTICLE HAVING COLUMNS

(75) Inventors: Michael D. Armacost, Wallkill, NY (US); Peter D. Hoh, Hopewell Junction, NY (US); Son V. Nguyen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 09/660,678

(22) Filed: Sep. 13, 2000

Related U.S. Application Data

(62) Division of application No. 08/883,761, filed on Jun. 27, 1997, now Pat. No. 6,187,412.

(51) Int. Cl.⁷ .......................... B32B 9/04; B32B 15/04; B32B 18/00
(52) U.S. Cl. ................. 428/119; 156/643.1; 156/657.1; 427/250; 427/253; 427/255.27; 427/255.393; 428/209; 428/446; 428/450; 428/469; 428/641; 428/648
(58) Field of Search ........................... 156/643.1, 657.1; 427/250, 253, 255.27, 255.393; 428/119, 446, 209, 430, 469, 641, 698

(56) References Cited

U.S. PATENT DOCUMENTS

| | | | |
|---|---|---|---|
| 3,475,882 A | 11/1969 | Hoenig | 55/179 |
| 4,968,382 A | 11/1990 | Jacobson et al. | 216/11 |
| 5,026,437 A | 6/1991 | Neukermans et al. | 148/33.3 |
| 5,179,043 A | 1/1993 | Weichold et al. | 437/225 |
| 5,217,567 A * | 6/1993 | Cote et al. | 156/643 |
| 5,218,515 A | 6/1993 | Bernhardt | 361/385 |
| 5,304,846 A | 4/1994 | Azar et al. | 257/722 |
| 5,332,485 A | 7/1994 | Thompson | 204/302 |
| 5,412,246 A | 5/1995 | Dobuzinsky et al. | 257/632 |
| 5,466,279 A | 11/1995 | Hattori et al. | 96/69 |
| 5,480,558 A | 1/1996 | El-Shoubary et al. | 210/703 |
| 5,506,753 A | 4/1996 | Bertin et al. | 361/705 |
| 5,645,684 A | 7/1997 | Keller | 156/643.1 |
| 5,702,822 A | 12/1997 | Terui et al. | 428/446 |
| 5,729,052 A | 3/1998 | Tonti et al. | 257/712 |
| 5,861,673 A * | 1/1999 | Yoo et al. | 257/758 |

* cited by examiner

*Primary Examiner*—Sandra M. Nolan
(74) *Attorney, Agent, or Firm*—Ira D. Blecker

(57) ABSTRACT

A silicon article including a silicon base and columns extending from the silicon base. The columns define a gap between the columns which is devoid of material so that the article can act as a filter or heat sink. Also disclosed is a method of making the silicon article.

5 Claims, 6 Drawing Sheets

METHOD OF MAKING SILICON ARTICLE HAVING COLUMNS

RELATED APPLICATION

This application is a division of U.S. patent application Ser. No. 08/883,761, filed Jun. 27, 1997, now U.S. Pat. No. 6,187,412.

FIELD OF THE INVENTION

The present invention relates to a silicon article processed by a semiconductor technique, and more particularly, relates to a silicon article having columns which is particularly suited for use as a filter, especially a charge and particulate selective filter, or as a heat sink.

BACKGROUND OF THE INVENTION

An advantage of processing techniques used in the semiconductor industry is that silicon structures can be made which have very fine submicron dimensions. Typically, such semiconductor processing techniques are used to make the wiring lines, trenches and other features of semiconductor devices. The present inventors, however, have invented new silicon structures which deviate from those found in present day semiconductor devices. Among these structures are those found particularly useful for filters, especially charge and particulate selective filters, and heat sinks.

The prior art is replete with various structures and apparatus for filter and heat sink applications. Prior art relating to filters will be discussed first.

Hoenig U.S. Pat. No. 3,475,882, the disclosure of which is incorporated by reference herein, discloses a chamber for separating gases based on their charge. The chamber further includes plates, coated with n-type and p-type semiconductor materials, on which a gas is adsorbed.

Thompson U.S. Pat. No. 5,332,485, the disclosure of which is incorporated by reference herein, discloses an electrostatic filter consisting of parallel electrodes separated by porous filter material. The porous filter material is meant to collect the fine particles only after they have been agglomerated.

Hattori et al. U.S. Pat. No. 5,466,279, the disclosure of which is incorporated by reference herein, discloses an electric dust collection system in which dust particles are first ionized and then collected on collector electrodes. A metal oxide semiconductor layer is formed on the collector electrodes. Particles are only separated by charge and then collected.

El-Shoubary et al. U.S. Pat. No. 5,480,558, the disclosure of which is incorporated by reference herein, discloses a crude apparatus for cleaning soils of contaminants. In one embodiment shown in FIG. 4, the apparatus consists of a platinum or carbon electrode embedded in a plurality of porous bags filled with an adsorbent material. The electrode attracts the contaminants which are adsorbed by the adsorbent material in the bag.

As is apparent from the above prior art, there is opportunity for improvement of filters, particularly those filters which are charge and particulate selective.

Accordingly, it is a purpose of the present invention to have am improved filter, especially an improved charge and particulate selective filter.

Turning now to prior art related to heat sinks, Weichold et al. U.S. Pat. No. 5,179,043, the disclosure of which is incorporated by reference herein, discloses micro heat pipes cut into semiconductor devices. The micro heat pipes are partially filled with heat conductive films to improve cooling.

Bernhardt U.S. Pat. No. 5,218,515, the disclosure of which is incorporated by reference herein, discloses a microchannel heat sink formed on the back side of a semiconductor device.

Azar et al. U.S. Pat. No. 5,304,846, the disclosure of which is incorporated by reference herein, discloses a semiconductor material heat sink having fins and channels. As shown in FIG. 16 of this reference, the heat sink is many times bigger than the semiconductor device that it is to cool.

Bertin et al. U.S. Pat. No. 5,506,753, the disclosure of which is incorporated by reference herein, discloses a semiconductor device having grooves on the inactive side for cooling. The grooves are 125–250 microns deep and 500–1000 microns wide.

In view of the above references, it would be desirable to have a heat sink that is improved in performance.

Accordingly, it is another purpose of the present invention to have an improved heat sink.

BRIEF SUMMARY OF THE INVENTION

According to a first aspect of the invention, there is disclosed a silicon article comprising:

a silicon base portion; and a plurality of columns extending from said base portion, said columns being circular or elliptical in crossection and comprising polysilicon or a metal, said columns defining open areas between said columns.

According to a second aspect of the invention, there is disclosed a method of making a silicon article comprising the steps of:

(a) applying a photoresist to a silicon substrate;

(b) exposing and developing said photoresist to form a pattern of openings;

(c) etching said silicon substrate through said pattern to form a pattern of trenches in said silicon substrate;

(d) removing said photoresist;

(e) heating said silicon substrate in a suitable atmosphere to form a thin oxide or nitride coating on the surface of said trenches;

(f) filling said trenches with polysilicon or a metal; and (g) removing said silicon surrounding said trenches to thereby leave columns of polysilicon or metal surrounded by said oxide or nitride coating.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
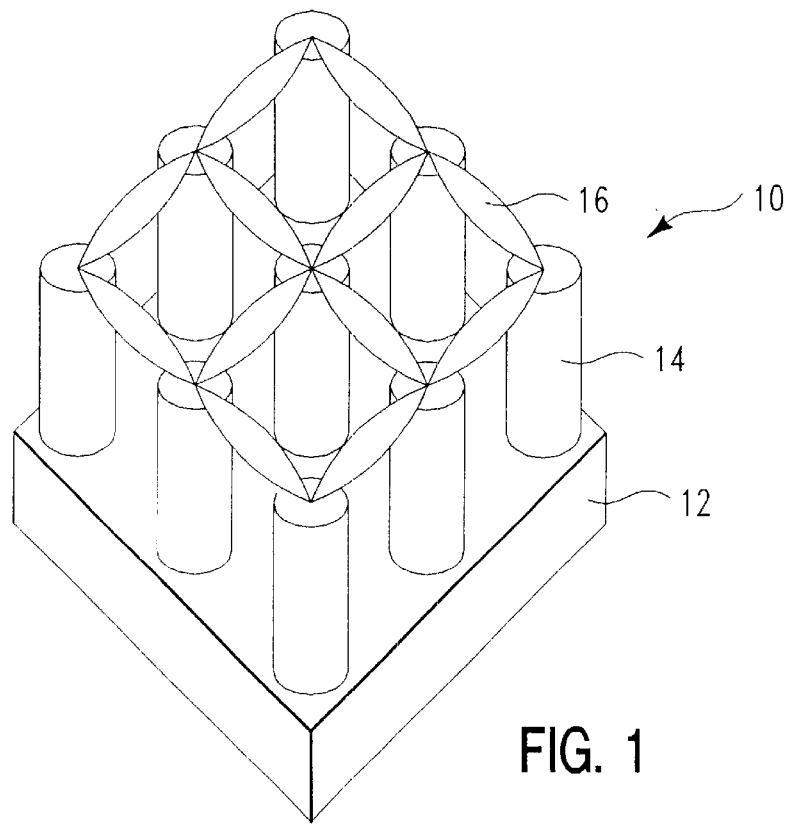
FIG. 1 is a perspective view of a first embodiment of the silicon article having columns according to the present invention.

Referring now to the Figures, and particularly referring to FIG. 1, there is shown, according to a first embodiment of the invention a silicon article, generally indicated by 10. The silicon article 10 comprises a base portion 12 and a plurality of columns 14 extending from the base portion 12. The columns will be circular or elliptical in crossection. While the base portion is made from silicon, the columns 14 are made from either polysilicon or metal, depending on the use of the silicon article 10. If the columns 10 are made from polysilicon, they may be plated with a suitable metal such as aluminum or copper. Lastly, the silicon article 10 further comprises a top portion 16 parallel to the base portion 12. The top portion 16 may be made from an oxide (such as $SiO_2$), a nitride (such as $Si_3N_4$) or a metal (such as aluminum or copper). As can be seen from FIG. 1, the columns 14 extend between the silicon base portion 12 and the top portion 16. In a preferred embodiment, the columns 14 should all be the same length.

As shown in FIG. 1, top portion 16 is made up of a number of lenticular segments. These segments could be rectangular or some other shape to fit the desired purpose of the article.

A particular advantage of the present invention is the fine dimensions that can be achieved for the silicon article 10, particularly the columns 14 and the spacing between the columns 14, due to the process by which the silicon article 10 is formed. With today's processing technology, the smallest columns 14 that can be achieved are circular columns having a diameter of 0.15 microns and elliptical columns having dimensions of 0.15 microns by 0.25 microns. The length of the columns 14 is on the order of 10 microns, although the length will be dictated by the aspect ratio (height/width) of the column 14. Further, the size and spacing of the columns 14, and their length, can be adjusted to fit the particular need of the silicon article 10. Thus, it is anticipated that the columns 14 can be made as large as 500 microns in crossectional dimension with a commensurate spacing between the columns 14 of 500 microns. The length may be as large as 500 microns as well. It is anticipated, however, that the present invention will be more applicable to applications requiring smaller dimensions than those just discussed.

The silicon article 10 may be sized to meet the application. For example, the silicon article 10 may be the size of a chip (such as 2 mm×3 mm) or the size of a wafer (currently as large as 300 mm in diameter). On a typical silicon chip, 2 mm×3 mm, with the crossectional dimension of the columns 14 being 0.15 microns×0.25 microns, the spacing being 0.15 microns, and the length being 10 microns, there are on the order of 100 million columns 14 on the chip. The number of columns 14, of course, will vary depending on the crossectional dimensions of the columns 14 as well as the overall size of the silicon article 10.

Figure 5:
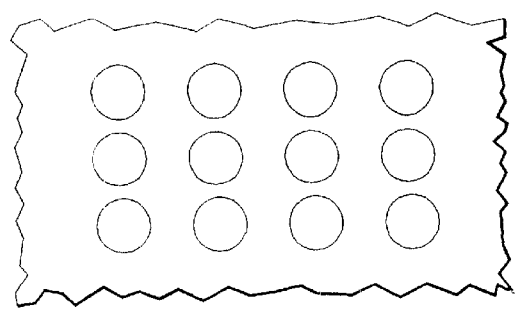
FIGS. 5 to 8 illustrate various arrangements for the columns of the silicon article according to the present invention.

Referring now to FIGS. 5 to 8, four different arrangements of the columns 14 are shown. In FIG. 5, all of the columns 14 have the same diameter and are equally spaced. The columns 14 also form a regular pattern of rows.

Figure 6:
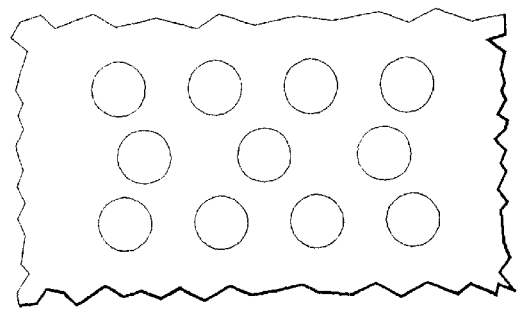

In FIG. 6, the columns are all of the same diameter and spacing but the rows are staggered.

Figure 7:
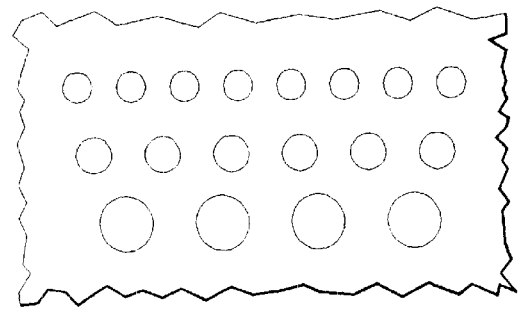

In FIG. 7, the arrangement of columns 14 is graded. That is, the rows of columns 14 vary in crossectional dimension and spacing of the columns from one edge of the base portion to the other.

Figure 8:
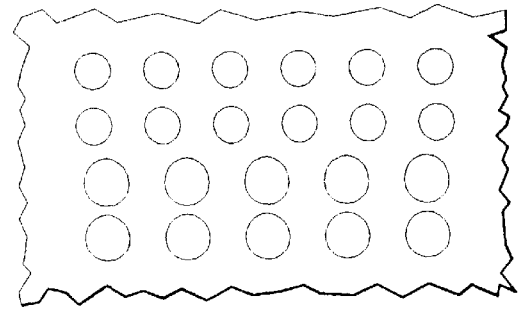

In FIG. 8, there are at least two distinct groups of columns 14, where one group of columns 14 is larger in crossectional dimension and spacing than the other group of columns. While there are two groups of columns 14 shown, it should be understood that there could be more than two distinct groups of columns 14.

The silicon article 10 shown in FIG. 1 has particular applicability as a filter and, more particularly, to filter micron and nanometer sized particles. The spacing of the columns 14 can be adjusted to fit the size of the particulates to be filtered. As shown in FIGS. 5 to 8, the silicon article 10 has great flexibility in meeting the filter requirements. If desired, the silicon article 10 may be just a particulate filter, in which case the silicon base portion 12 and columns 14 do not need to have any electrical function.

It is a particular application of the present invention that the silicon article 10 be used to filter charges instead of, or in addition to, particulates. In this situation, the silicon base portion 12 and columns 14 need to be electrically conducting. To accomplish this objective, the silicon base portion 12 should be doped to form a semiconductor, as is well known to those skilled in the art. Too, the columns 14 need to be conducting so if they are made from polysilicon, they should be doped as well so as to become semiconducting. Alternatively, the polysilicon columns may be coated with a metal or conductor or the columns 14 may simply be made from a metal or conductor. Any metal or conductor that can be conformally deposited would be acceptable. Some examples are aluminum, copper, tungsten, their suicides and pseudo-conductors such as titanium nitride.

Where the columns 14 are made from polysilicon, whether doped or not, it is preferred that the columns be coated with an oxide or nitride (for example, $SiO_2$ or $Si_3N_4$, respectively). There are two reasons for so coating the columns 14. The first is that the coating protects the columns during the formation thereof, as will be discussed hereafter. The second reason is that the coating protects the columns from chemical attack when the silicon article 10 is used in a corrosive environment.

Figure 2:
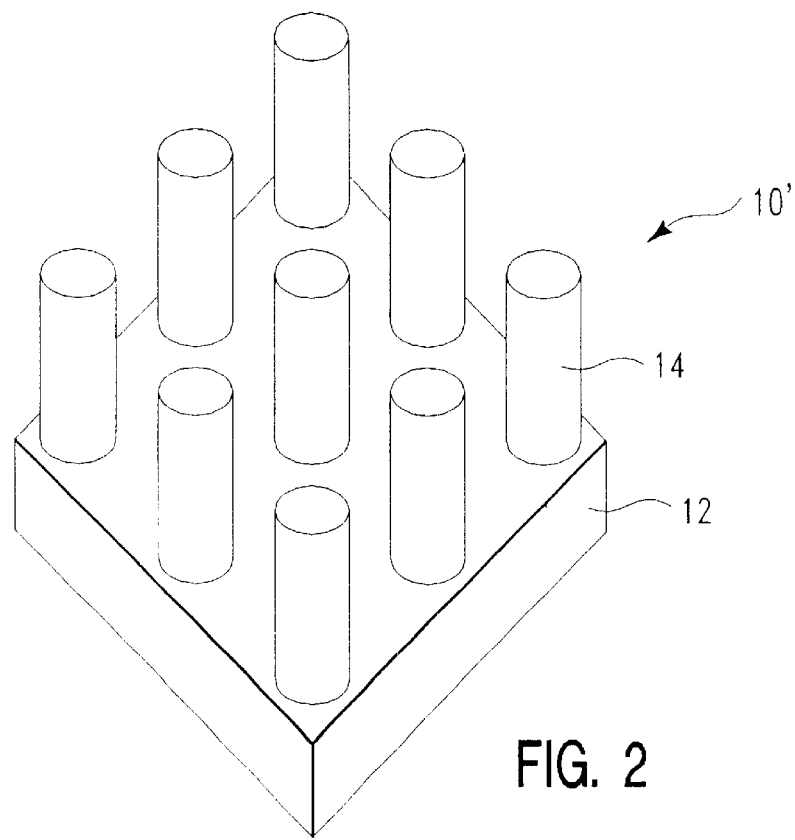
FIG. 2 is a perspective view of a second embodiment of the silicon article having columns according to the present invention.

Referring now to FIG. 2, there is shown a second embodiment of the invention. As shown in FIG. 2, silicon article 10' is substantially similar to silicon article 10 shown in FIG. 1 except that silicon article 10' does not have top portion 16. In addition, silicon article 10' is meant to be used as a heat sink, preferably in microelectronics and micromechanical devices to increase cooling of the device. Since silicon article 10' need only conduct heat, it is unnecessary that silicon article 10' perform any electrical function. Accordingly, silicon base portion 12 need not be doped, nor do columns 14 need to be doped if they are made from polysilicon. What is important is that columns 14 be thermally conductive. Thus, the columns 14, if made from polysilicon, should be plated with a metal or conductor or, alternatively, may be made entirely from a metal or conductor. The metal and conductors useable are the same as those mentioned above.

As shown in FIG. 2, silicon base portion 12 is planar in nature. While not shown in the Figures, it is within the scope of the invention for silicon base portion to be curvilinear to fit, for example, on the outside of a motor housing.

Figure 3A:
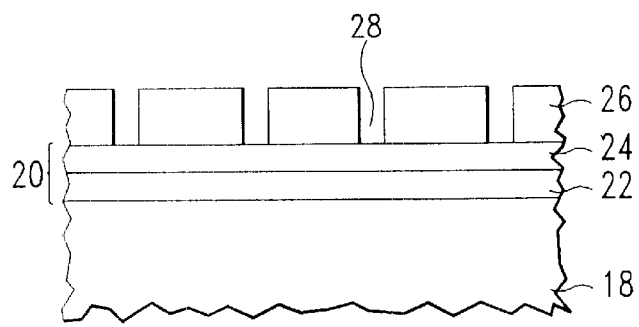
FIGS. 3A to 3H illustrate the method for forming the first embodiment of the silicon article having columns according to the present invention.
Figure 3B:
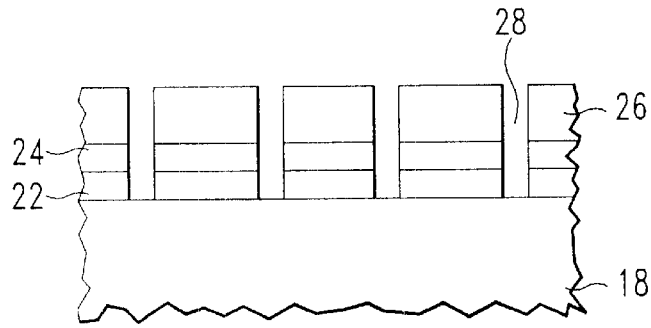
Figure 3C:
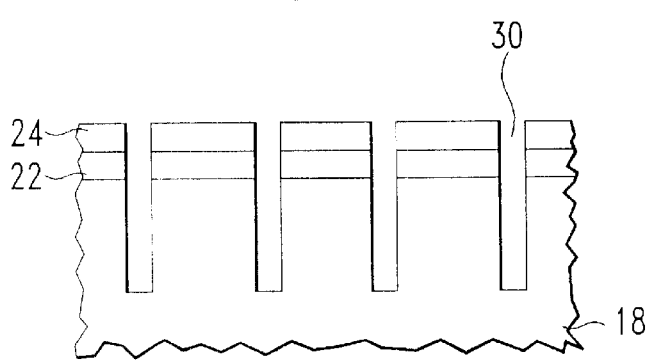
Figure 3D:
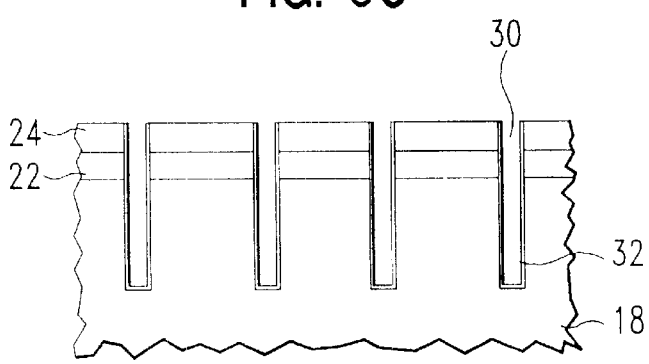
Figure 3E:
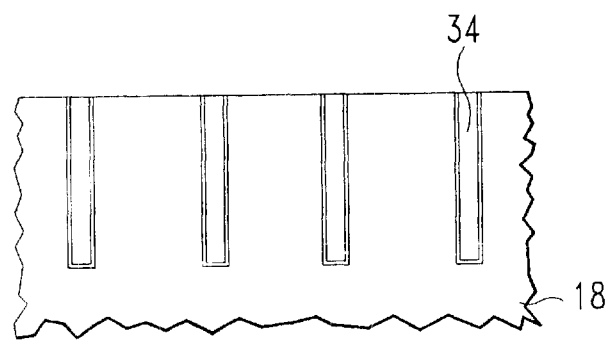
Figure 3F:
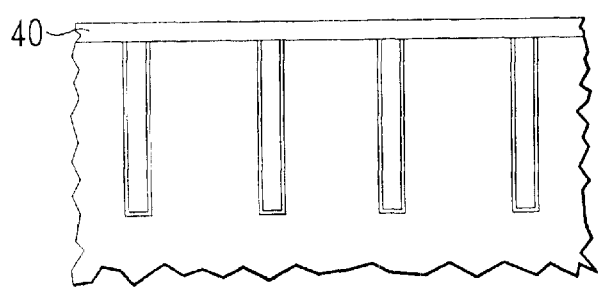
Figure 3G:
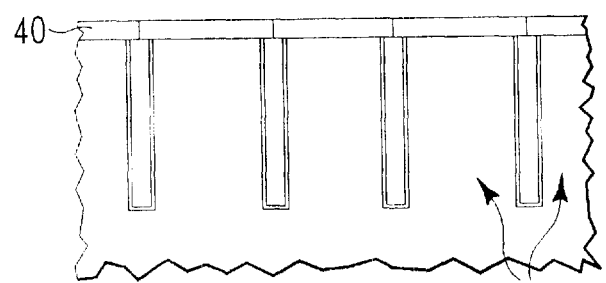
Figure 3H:
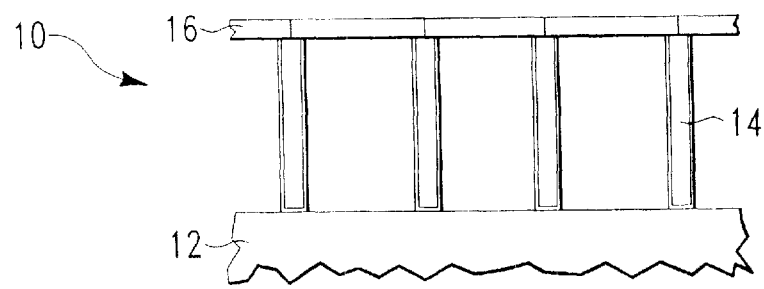

The method to produce silicon article 10 will now be described with reference to FIGS. 3A to 3H. Referring to FIG. 3A, layer 20 (approximately 1 micron thick) is deposited on silicon wafer 18. Layer 20 may be a single unitary layer of an oxide, nitride or metal or, as shown in FIG. 3A, it is comprised of separate layers 22 and 24, which may be, for example, $Si_3N_4$ and $SiO_2$, respectively. Thereafter, photoresist 26 (several microns thick) is deposited on layer 20 and then exposed and developed to form pattern 28. Layer 20 is etched with traditional dielectric dry etch plasma chemistries and equipment to continue the pattern 28. Most fluorinated chemistries, such as $CHF_3/CF_4$, will work. The photoresist 26 is then stripped. Silicon wafer 18 is etched with a fluorinated-brominated gas, for example, HBr—$NF_3$—$O_2$, to form trenches 30, as shown in FIG. 3C. In the semiconductor arts, trenches are simply blind holes formed in the underlying silicon substrate. In terms of the present invention, trenches 30 are circular or elliptical in form. A thin oxide or nitride 32 is then grown on the walls of the trench 30, as shown in FIG. 3D, by briefly exposing the patterned wafer to a high temperature in a suitable atmosphere containing oxygen or nitrogen. Layer 20 is then removed by any suitable means. If layer 20 comprises layer 22 of $Si_3N_4$ and layer 24 of $SiO_2$, the $SiO_2$ may be removed with HF and the $Si_3N_4$ may be removed with hot $H_3PO_4$. Thereafter, as shown in FIG. 3E, polysilicon or a metal 34 is deposited in the trenches 30 by any suitable process, such as chemical vapor deposition, and then planarized. A suitable layer 40 of an oxide, nitride or metal is then deposited on wafer 18, as shown in FIG. 3F, and then patterned and etched to result in the structure shown in FIG. 3G. Lastly, wafer 18 is etched with a fluorinated isotropic plasma, such as $SF_6$ or $CF_4$, to remove the silicon 36 surrounding the columns 14. The resulting structure is represented in FIG. 3H.

Figure 4A:
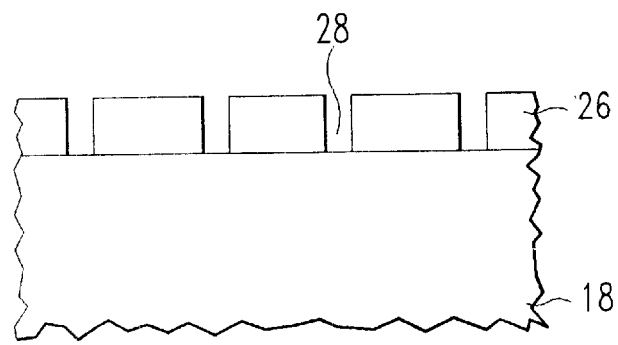
FIGS. 4A to 4G illustrate the method for forming the second embodiment of the silicon article having columns according to the present invention.
Figure 4B:
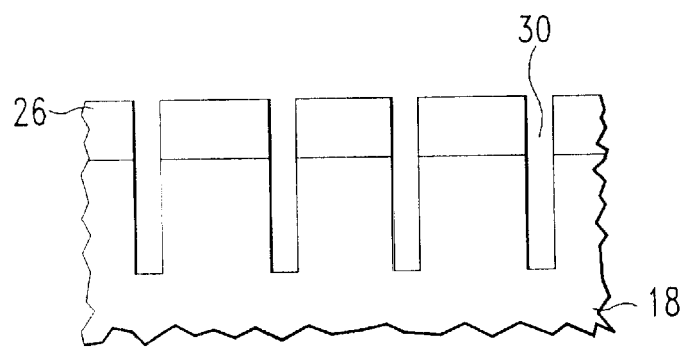
Figure 4C:
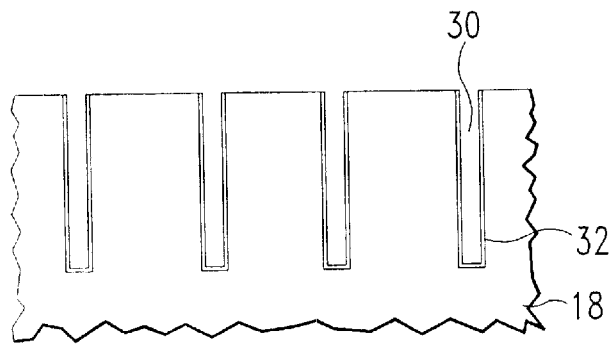
Figure 4D:
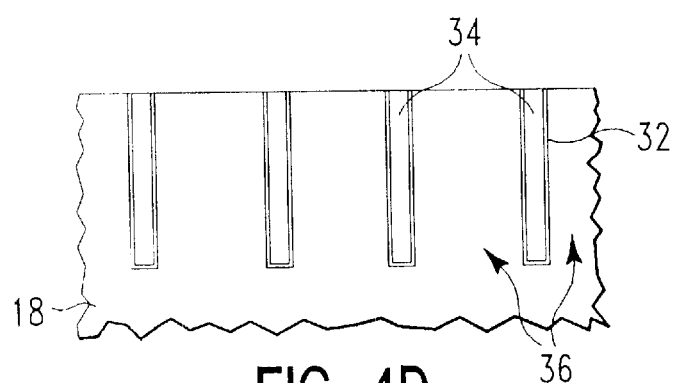
Figure 4E:
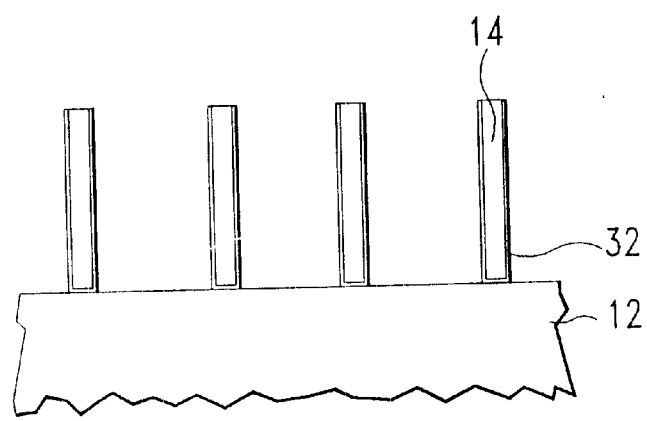
Figure 4F:
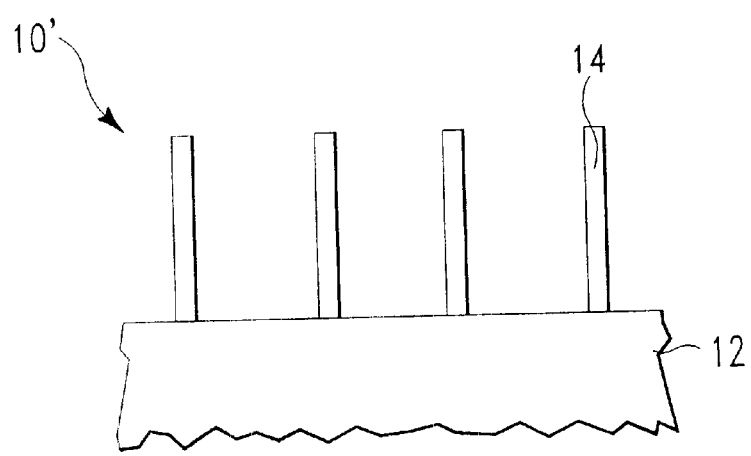
Figure 4G:
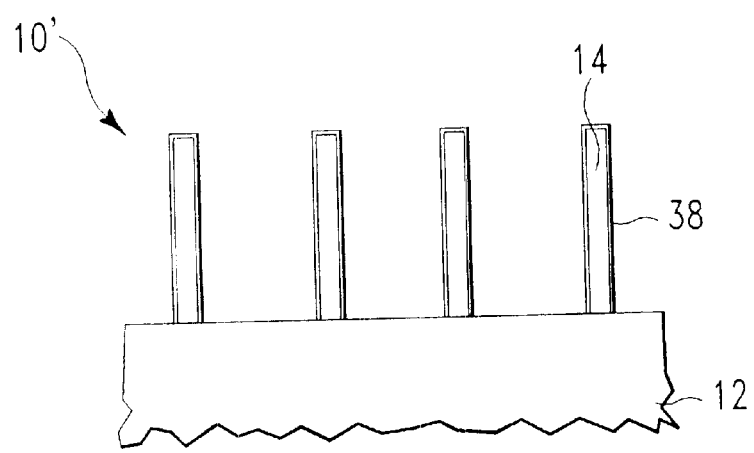

The method to produce the second embodiment of the invention, shown in FIG. 2 as silicon article 10', will now be described with reference to FIGS. 4A to 4G. The method to form the silicon article 10' is similar to the method to form silicon article 10 as discussed above. Referring to FIG. 4A, photoresist 26 is deposited on silicon 18 and then exposed and developed to form pattern 28. Silicon wafer 18 is etched with a fluorinated gas, for example, HBr—$NF_3$—$O_2$, to form trenches 30, as shown in FIG. 4B. (Note that layer 20, discussed in the previous embodiment, could be used here for deeper trenches or finer feature pitch.) The photoresist 26 is then stripped. A thin oxide or nitride 32 is then grown on the walls of the trench 30, as shown in FIG. 4C, by briefly exposing the patterned wafer to a high temperature in a suitable atmosphere containing oxygen or nitrogen. Thereafter, as shown in FIG. 4D, polysilicon or a metal 34 is deposited in the trenches 30 by any suitable process such as chemical vapor deposition. As illustrated in FIG. 4E, wafer 18 is etched with a fluorinated isotropic plasma, such as $SF_6$ or $CF_4$, to remove the silicon 36 surrounding the columns 14. Then, thin oxide or nitride 32 is removed by a suitable etchant such as buffered HF acid to result in the structure shown in FIG. 4F. If columns 14 are made from metal, nothing more need to be done to the structure. However, if columns 14 are polysilicon, they need to be plated with a suitable metal, such as aluminum or copper, to form metal coating 38 on the columns 14 in order to make columns 14 thermally conducting. This resulting structure is shown in FIG. 4G.

The following Example will illustrate the invention.

EXAMPLE

To a silicon wafer, 0.2 microns of $SiN_x$ and 0.7 microns of $SiO_2$ were applied by a CVD process. A photoresist was applied over the $Si_3N_x$ and then exposed and developed to form the pattern of openings. The $SiO_2$ and $SiN_x$ layers were etched through using a RIE $CHF_3/CF_4$ plasma to continue the pattern, thereby forming a "hard mask". The photoresist was then stripped. Trenches were formed in the silicon by etching the silicon through the hard mask with an HBr—$NF_3$—$O_2$ gas mixture at room temperature. The photoresist was then stripped. Thereafter, a thermal oxide was grown on the walls of the trenches by exposing the wafer to a temperature of 900 degrees Centigrade for approximately 1 minute in an oxygen atmosphere. The thickness of the thermal oxide is approximately 100 angstroms. The trenches were filled by polysilicon which was deposited by a standard silane CVD process at 500° C. to 700° C. The "hard mask" was removed by first etching with HF followed by etching with hot $H_3PO_4$. Thereafter, the wafer is planarized by a conventional chemical-mechanical polishing process to level the polysilicon with the wafer. A thin layer of $SiO_2$ was deposited on the wafer, patterned and etched with HF. The wafer was then etched with 100% $SF_6$ to remove the silicon around the columns. The structure formed was identical to that shown in FIG. 1.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of making a silicon article comprising the steps of:
    (a) applying a photoresist to a silicon substrate;
    (b) exposing and developing said photoresist to form a pattern of openings;
    (c) etching said silicon substrate through said pattern to form a pattern of trenches in said silicon substrate;
    (d) removing said photoresist;
    (e) heating said silicon substrate in a suitable atmosphere to form a thin oxide or nitride coating on the surface of said trenches;
    (f) filling said trenches with a material consisting of polysilicon or a metal; and
    (g) removing said silicon surrounding said trenches to thereby leave columns consisting of polysilicon or metal extending from the silicon substrate surrounded by said oxide or nitride coating.

2. The method of claim 1 further comprising the step of forming a layer on said silicon substrate prior to step (a), wherein said layer is selected from the group of materials consisting of oxides, nitride and metals and wherein said layer is patterned and etched after step (b) but before step (c).

3. The method of claim 1 further comprising the step of planarizing said trenches after step (f).

4. The method of claim 1 further comprising the step of removing said thin oxide or nitride coating after step (g).

5. The method of claim 4 further comprising the step of plating said columns with a metal.

* * * * *